United States Patent
Prall

(10) Patent No.: US 7,072,217 B2
(45) Date of Patent: Jul. 4, 2006

(54) MULTI-STATE MEMORY CELL WITH ASYMMETRIC CHARGE TRAPPING

(75) Inventor: Kirk Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 200 days.

(21) Appl. No.: 10/785,785

(22) Filed: Feb. 24, 2004

(65) Prior Publication Data

US 2005/0185466 A1    Aug. 25, 2005

(51) Int. Cl.
*G11C 16/04* (2006.01)

(52) U.S. Cl. .......................... 365/185.17; 365/185.03; 365/185.28

(58) Field of Classification Search ............ 365/185.15, 365/185.17, 185.21, 185.29, 185.03, 185.28; 257/314, 322

See application file for complete search history.

(56) References Cited

U.S. PATENT DOCUMENTS

| | | |
|---|---|---|
| 4,184,207 A | 1/1980 | McElroy |
| 4,330,930 A | 5/1982 | Morley |
| 4,420,504 A | 12/1983 | Cooper |
| 4,755,864 A | 7/1988 | Ariizumi |
| 4,881,114 A | 11/1989 | Mohsen |
| 5,241,496 A | 8/1993 | Lowrey |
| 5,330,930 A | 7/1994 | Chi |
| 5,378,647 A | 1/1995 | Hong |
| 5,379,253 A | 1/1995 | Bergemont |
| 5,397,725 A | 3/1995 | Wolstenholme |
| 5,467,305 A | 11/1995 | Bertin |
| 5,576,236 A | 11/1996 | Chang |
| 5,768,192 A | 6/1998 | Eitan |
| 5,792,697 A | 8/1998 | Wen |
| 5,801,401 A | 9/1998 | Forbes ........................ 257/77 |
| 5,858,841 A | 1/1999 | Hsu |
| 5,911,106 A | 6/1999 | Tasaka |
| 5,946,558 A | 8/1999 | Hsu |
| 5,966,603 A | 10/1999 | Eitan |
| 5,994,745 A | 11/1999 | Hong |
| 6,011,725 A | 1/2000 | Eitan |
| 6,028,342 A | 2/2000 | Chang |
| 6,030,871 A | 2/2000 | Eitan |
| 6,044,022 A | 3/2000 | Nachumovsky |

(Continued)

FOREIGN PATENT DOCUMENTS

EP        84303740.9        1/1985

(Continued)

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.

(Continued)

*Primary Examiner*—Tuan T. Nguyen
*Assistant Examiner*—Alexander Sofocleous
(74) *Attorney, Agent, or Firm*—Leffert Jay & Polglaze, P.A.

(57) ABSTRACT

A multi-state NAND memory cell is comprised of two drain/source areas in a substrate. An oxide-nitride-oxide structure is formed above the substrate between the drain/source areas. The nitride layer acting as an asymmetric charge trapping layer. A control gate is located above the oxide-nitride-oxide structure. An asymmetrical bias on the drain/source areas causes the drain/source area with the higher voltage to inject an asymmetric distribution hole by gate induced drain leakage injection into the trapping layer substantially adjacent that drain/source area.

4 Claims, 4 Drawing Sheets

U.S. PATENT DOCUMENTS

| | | | |
|---|---|---|---|
| 6,081,456 A | 6/2000 | Dadashev | |
| 6,108,240 A | 8/2000 | Lavi | |
| 6,133,102 A | 10/2000 | Wu | |
| 6,134,156 A | 10/2000 | Eitan | |
| 6,147,904 A | 11/2000 | Liron | |
| 6,157,570 A | 12/2000 | Nachumovsky | |
| 6,172,396 B1 | 1/2001 | Chang | |
| 6,174,758 B1 | 1/2001 | Nachumovsky | |
| 6,175,523 B1 | 1/2001 | Yang | |
| 6,181,597 B1 | 1/2001 | Nachumovsky | |
| 6,184,089 B1 | 2/2001 | Chang | |
| 6,201,282 B1 | 3/2001 | Eitan | |
| 6,201,737 B1 | 3/2001 | Hollmer | |
| 6,204,529 B1 | 3/2001 | Lung | |
| 6,207,504 B1 | 3/2001 | Hsieh | |
| 6,208,557 B1 | 3/2001 | Bergemont | |
| 6,215,702 B1 | 4/2001 | Derhacobian | |
| 6,218,695 B1 | 4/2001 | Nachumovsky | |
| 6,222,768 B1 | 4/2001 | Hollmer et al. | |
| 6,240,020 B1 | 5/2001 | Yang | |
| 6,243,300 B1 | 6/2001 | Sunkavalli | |
| 6,251,731 B1 | 6/2001 | Wu | |
| 6,255,166 B1 | 7/2001 | Ogura | |
| 6,256,231 B1 | 7/2001 | Lavi | |
| 6,266,281 B1 | 7/2001 | Derhacobian | |
| 6,269,023 B1 | 7/2001 | Derhacobian | |
| 6,272,043 B1 | 8/2001 | Hollmer | |
| 6,275,414 B1 | 8/2001 | Randolph | |
| 6,282,118 B1 | 8/2001 | Lung | |
| 6,288,943 B1 | 9/2001 | Chi | |
| 6,291,854 B1 | 9/2001 | Peng | |
| 6,297,096 B1 | 10/2001 | Boaz | |
| 6,303,436 B1 | 10/2001 | Sung | |
| 6,327,174 B1 | 12/2001 | Jung | |
| 6,348,711 B1 | 2/2002 | Eitan | |
| 6,392,930 B1 | 5/2002 | Jung | |
| 6,417,053 B1 | 7/2002 | Kuo | |
| 6,421,275 B1 | 7/2002 | Chen | |
| 6,429,063 B1 | 8/2002 | Eitan | |
| 6,432,778 B1 | 8/2002 | Lai | |
| 6,461,949 B1 | 10/2002 | Chang | |
| 6,468,864 B1 | 10/2002 | Sung | |
| 6,469,342 B1 | 10/2002 | Kuo | |
| 6,477,084 B1 | 11/2002 | Eitan | |
| 6,486,028 B1 | 11/2002 | Chang | |
| 6,487,050 B1 | 11/2002 | Liu | |
| 6,498,377 B1 | 12/2002 | Lin | |
| 6,514,831 B1 | 2/2003 | Liu | |
| 6,531,887 B1 | 3/2003 | Sun | |
| 6,545,309 B1 | 4/2003 | Kuo | |
| 6,552,387 B1 | 4/2003 | Eitan | 257/324 |
| 6,559,013 B1 | 5/2003 | Pan | |
| 6,576,511 B1 | 6/2003 | Pan | |
| 6,580,135 B1 | 6/2003 | Chen | |
| 6,580,630 B1 | 6/2003 | Liu | |
| 6,602,805 B1 | 8/2003 | Chang | |
| 6,607,957 B1 | 8/2003 | Fan | |
| 6,610,586 B1 | 8/2003 | Liu | |
| 6,613,632 B1 | 9/2003 | Liu | |
| 6,617,204 B1 | 9/2003 | Sung | |
| 6,774,433 B1 | 8/2004 | Lee et al. | 257/326 |
| 6,829,175 B1* | 12/2004 | Tsai et al. | 365/185.29 |
| 2001/0001075 A1 | 5/2001 | Ngo | |
| 2001/0004332 A1 | 6/2001 | Eitan | |
| 2001/0011755 A1 | 8/2001 | Tasaka | |
| 2002/0142569 A1 | 10/2002 | Chang | |
| 2002/0146885 A1 | 10/2002 | Chen | |
| 2002/0151138 A1 | 10/2002 | Liu | |
| 2002/0177275 A1 | 11/2002 | Liu | |
| 2002/0182829 A1 | 12/2002 | Chen | |
| 2003/0032243 A1 | 2/2003 | Ogura et al. | 438/257 |
| 2003/0057997 A1 | 3/2003 | Sun | |
| 2003/0067807 A1 | 4/2003 | Lin | |
| 2003/0080370 A1 | 5/2003 | Harari et al. | 438/257 |
| 2003/0117861 A1 | 6/2003 | Maayan | |
| 2003/0193062 A1 | 10/2003 | Jong | |
| 2004/0084706 A1* | 5/2004 | Osabe et al. | 257/298 |
| 2004/0109354 A1* | 6/2004 | Wang et al. | 365/185.11 |
| 2004/0178470 A1 | 9/2004 | Hieda | 257/510 |
| 2005/0133860 A1 | 6/2005 | Forbes | 257/330 |

FOREIGN PATENT DOCUMENTS

| | | |
|---|---|---|
| EP | 90115805.5 | 2/1991 |
| EP | 01113179.4 | 12/2002 |
| EP | 1 324 380 A2 | 7/2003 |
| WO | WO 03/030264 A1 | 4/2003 |
| WO | WO 03/038907 A1 | 5/2003 |

OTHER PUBLICATIONS

B. Eitan et al., "Spatial Characterization of Hot Carriers Injected into the Gate Dielectric Stack of a MOFSET Based on Non-Volatile Memory Device," date unknown, pp. 58-60.

B. Eitan et al., "NROM: A Novel Localized Trapping, 2-Bit Nonvolatile Memory Cell," IEEE Electron Device Lett, vol. 21, No. 11, (Nov. 2000), pp. 543-545, Copyright 2000 IEEE.

E. Maayan et al., "A 512Mb NROM Flash Data Storage Memory with 8MB/s Data Range," Dig. IEEE Int. Solid-State Circuits Conf., San Francisco, (Feb. 2002), pp. 1-8, Copyright Saifun Semiconductors, Ltd. 2002.

E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp. 76-77, 407-408. Copyright 1990 IEEE.

M. Janai, "Data Retention, Endurance and Acceleration Factors of NROM Devices," IEEE 41st Annual International Reliability Physics Symposium, Dallas, TX (2003), pp. 502-505, Copyright 1989 IEEE.

S. Minami and Y. Kamigaki, "A Novel MONOS Nonvolatile Memory Device Ensuring 10-Year Data Retention after $10^7$ Erase/Write Cycles," IEEE Transactions on Electron Devices, vol. 40, No. 11 (Nov. 1993) pp. 2011-2017, Copyright 1998 IEEE.

C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990), pp. 1439-1443, Copyright 1990 IEEE.

P. Manos and C. Hart, "A Self-Aligned EPROM Structure with Superior Data Retention," IEEE Electron Device Letters, vol. 11, No. 7, (Jul. 1990) pp. 309-311, Copyright 1990 IEEE.

W. Owen and W. Tchon, "$E^2$PROM Product Issues and Technology Trends," IEEE 1989, pp. 17-19, Copyright 1989 IEEE.

T. Huang, F. Jong, T. Chao, H. Lin, L. Leu, K. Young, C. Lin, K. Chiu, "Improving Radiation Hardness of EEPROM/Flash Cell By $N_2$O Annealing," IEEE Electron Device Letters, vol. 19, No. 7 (Jul. 1998), pp. 256-258, Copyright 1998 IEEE.

B. Eitan et al., "Electrons Retention Model for Localized Charge in Oxide -Nitride-Oxide (ONO) Dielectric," IEEE Device Lett., vol. 23, No. 9, (Sep. 2002), pp. 556-558. Copyright 2002 IEEE.

T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.

F. Vollebregt, R. Cuppens, F. Druyts, G. Lemmen, F. Verberne, J. Solo, "A New E(E)PROM Technology With a $TiSi_2$ Control Gate," IEEE 1989, pp. 25.8.1-25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

S. Ogura, et al. "Twin MONOS Cell with Dual Control Gates," Halo LSI and New Halo, pp. 187-187.3, Date Unknown.

T. Sugizaki, et al. "New 2-bit/Tr MONOS Type Flash Memory using $Al_2O_3$ as Charge Trapping Layer," Fujitsu Laboratories Ltd, Date Unknown.

T. Saito, et al. "Hot Hole Erase Characteristics and Reliability in Twin MONOS Device" Halo LSI, Date Unknown.

Saifun Semiconductors, LTD. PowerPoint Presentation, Date Unknown.

Y. Roizin, et al. "Novel Techniques for data retention and Leff measurements in two bit MicroFlash® Memory Cells," Characterization and Metrology for ULSI Technology: 200 International Conf., pp. 181-185, Copyright 2001 American Institute of Physics, 1-56396-967-X/01.

W. J. Tsai, et al. "Cause of Data Retention Loss in a Nitride-Based Localized Trapping Storage Flash Memory Cell," IEEE 40th Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al., "Subthreshold slope degradation model for localized-charge-trapping based non-volatile memory devices," Solid-State Electronics 47 (2003), pp. 937-941. Copyright 2003 Elsevier Science Ltd.

R. Neale, "AMD's MirrorBit—a big step in Flash progress," Electronic Engineering Design, V. 74, No. 906, pp. 47-50.

I. Bloom, et al., "NROM™ -a new technology for non-volatile memory products" Solid-State Electronics 46 (2002), pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001 pp. 534-535.

A. Nughin, "n-Channel 256kb and 1Mb EEPROMs," ISSCC91, Session 134, Special Session on Technology in the USSR, Paper 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., Date Unknown.

L. Breuil, et al., "A new 2 isolated-bits/cell flash memory device with self aligned split gate structure using ONO stacks for charge storage," IMEC, Date Unknown.

J. Willer, et al., "UMEM: A U-shape Non-Volatile-Memory Cell," Ingentix GmbH &Co. KG., Infineon Technologies and Saifun Semiconductors, Date Unknown.

S. Kang, et al., "A Study of SONOS Nonvolatile Memory Cell Controlled Structurally by Localizing Charge-Trapping Layer," Samsung Electrons Co., Ltd., Date Unknown.

Y. Roizin, et al., "In-Process Charging in microFLASH® Memory Cells," Tower Semiconductor, Ltd., Date Unknown.

A. Shappir, et al., "Subthreshold slope degradation model for localized-charge-trapping based non-volatile memory devices," Solid State Electronics, 47 (2003) pp. 937-941, Copyright 2003 Elsevier Science Ltd.

I. Fujiwara, et al., "High speed program/erase sub 100 nm MONOS memory cell," Sony Corporation, Date Unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., Date Unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao-Tung University, Date Unknown.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., Date Unknown.

J. H. Kim, et al., "Highly Manufacturable SONOS Non-Volatile Memory for the Embedded SoC Solution," 2003 Symposium on VLSI Technology Digest of Technical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D. M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infineon Technologies, Date Unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, Date Unknown.

Y. Roizin, et al., "Retention Characteristics of microFLASH® Memory (Activation Energy of Traps in the ONO Stack)," Tower Semiconductor, Ltd., Date Unknown.

Y. Roizin, et al., "Activation Energy of Traps in the ONO Stack of microFLASH® Memory Cells," Tower Semiconductor, Ltd., Date Unknown.

Y. Roizin, et al., "Dummy Gox for Optimization of microFLASH® Technology," Tower Semiconductor, Ltd., Date Unknown.

Y. K. Lee, et al., "Multi-Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI., Date Unknown.

J. Bu, et al., "Retention Reliability Enhanced SONOS NVSM with Scaled Programming Voltage," Microelectronics Lab., Date Unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147-148.

Z. Liu, et al "Metal Nanocrystal Memories—Part II: Electrical Characteristics", IEEE Transactions on Electron Devices, IEEE Inc., New York, U.S., vol. 49, No. 9, Sep. 2002 pp. 1614-1622.

* cited by examiner

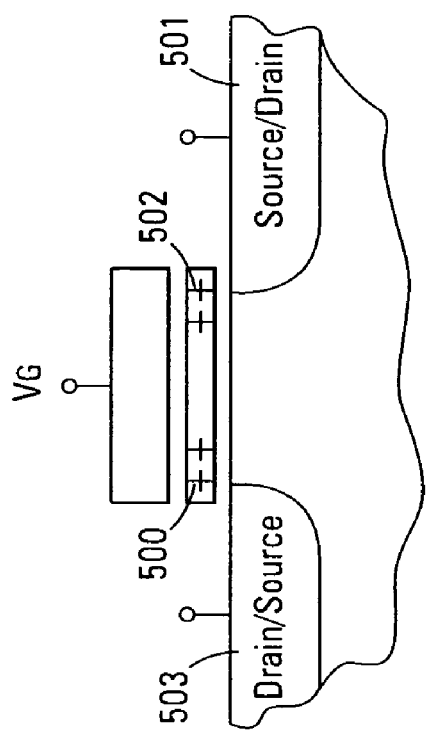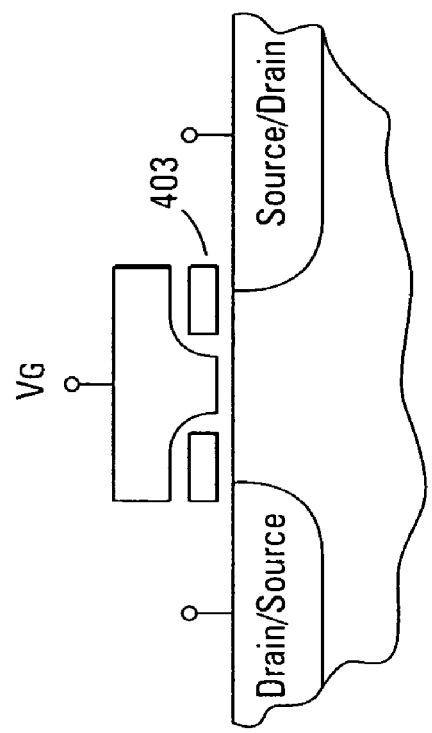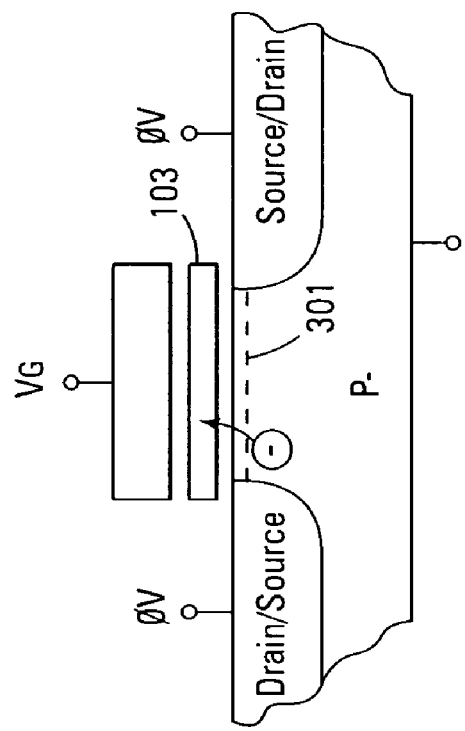

| OPERATION | Vd | Vd' | Vgd | VWL1 | VWL2 | VWL3 | Vgs | Vs | Vs' |
|---|---|---|---|---|---|---|---|---|---|
| Erase (option 1) | gnd | gnd | +VH/2 | +VH | +VH | +VH | +VH/2 | gnd | gnd |
| Erase (option 2) | O/C | O/C | O/C | +VH | +VH | +VH | O/C | O/C | O/C |
| pgm VWL2 (L) | +VDP | gnd | Vx1 | Vx2 | -VH | Vx2 | Vx1 | gnd | gnd |
| pgm VWL2 (R) | gnd | gnd | Vy1 | Vy2 | -VH | Vy2 | Vx1 | +VDP | gnd |
| Read VWL2 (L) | gnd | gnd | Vy1 | Vy2 | VR | Vy2 | Vy1 | +VDR | gnd |
| Read VWL2 (R) | Vdr | gnd | Vy1 | Vy2 | VR | Vy2 | Vy1 | gnd | gnd |

MULTI-STATE MEMORY CELL WITH ASYMMETRIC CHARGE TRAPPING

TECHNICAL FIELD OF THE INVENTION

The present invention relates generally to memory cells and in particular the present invention relates to multi-state non-volatile memory cells.

BACKGROUND OF THE INVENTION

Memory devices are available in a variety of styles and sizes. Some memory devices are volatile in nature and cannot retain data without an active power supply. A typical volatile memory is a DRAM which includes memory cells formed as capacitors. A charge, or lack of charge, on the capacitors indicate a binary state of data stored in the memory cell. Dynamic memory devices require more effort to retain data than non-volatile memories, but are typically faster to read and write.

Non-volatile memory devices are also available in different configurations. For example, floating gate memory devices are non-volatile memories that use floating gate transistors to store data. The data is written to the memory cells by changing a threshold voltage of the transistor and is retained when the power is removed. The transistors can be erased to restore the threshold voltage of the transistor. The memory may be arranged in erase blocks where all of the memory cells in an erase block are erased at one time. These non-volatile memory devices are commonly referred to as flash memories.

Flash memories may use floating gate technology or trapping technology. Floating gate cells include source and drain regions that are laterally spaced apart to form an intermediate channel region. The source and drain regions are formed in a common horizontal plane of a silicon substrate. The floating gate, typically made of doped polysilicon, is disposed over the channel region and is electrically isolated from the other cell elements by oxide. The non-volatile memory function for the floating gate technology is created by the absence or presence of charge stored on the isolated floating gate. The trapping technology functions as a non-volatile memory by the absence or presence of charge stored in isolated traps that capture and store electrons or holes.

In order for memory manufacturers to remain competitive, memory designers are constantly trying to increase the density of flash memory devices. Increasing the density of a flash memory device generally requires reducing spacing between memory cells and/or making memory cells smaller. Smaller dimensions of many device elements may cause operational problems with the cell. For example, the channel between the source/drain regions becomes shorter possibly causing severe short channel effects. Additionally, possible charge migration from one corner of the cell to the other becomes more of a concern with smaller cell size.

For the reasons stated above, and for other reasons stated below which will become apparent to those skilled in the art upon reading and understanding the present specification, there is a need in the art for higher density memory devices.

SUMMARY

The above-mentioned problems with memory density and other problems are addressed by the present invention and will be understood by reading and studying the following specification.

The present invention encompasses a multi-state NAND memory structure. The structure comprises a substrate comprising a first conductive material. First and second active areas are formed within the substrate. The first and second active areas are made up of a second conductive material. In one embodiment, the first conductive material is a p-type material and the second conductive material is an n-type material.

A control gate is located above and between the first and second active areas. A trapping layer is located between the control gate and the substrate. The trapping layer is isolated from the control gate by a first dielectric layer and from the substrate by a second dielectric layer. The trapping layer is capable of asymmetrical charge trapping in response to asymmetrical biasing of the first and second active areas. This permits storage of a first data bit adjacent to the first active area and a second data bit adjacent to the second active area.

Further embodiments of the invention include methods and apparatus of varying scope.

BRIEF DESCRIPTION OF THE DRAWINGS

FIG. 3 shows a cut-away view of an embodiment for erasing a multi-state NAND memory cell with asymmetric charge trapping of the present invention.

FIG. 4 shows a cut-away view of yet another embodiment of a multi-state NAND memory cell with asymmetric charge trapping of the present invention.

FIG. 5 shows a cut-away view of an embodiment for reading the multi-state NAND memory cell with asymmetric charge trapping of the present invention.

DETAILED DESCRIPTION

Figure 2:
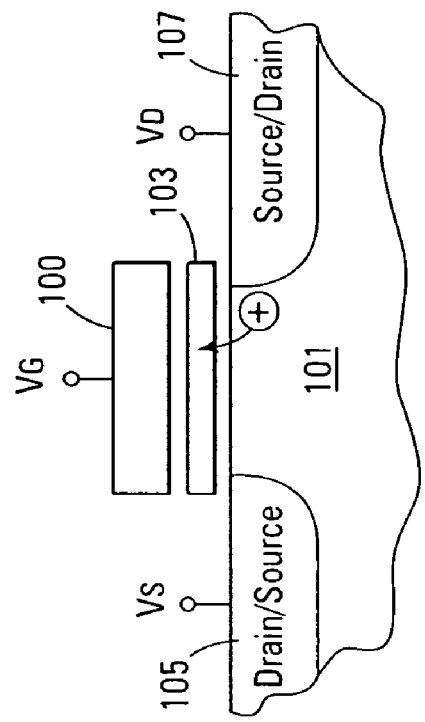
FIG. 2 shows a cut away view of another embodiment for programming a multi-state NAND memory cell with asymmetric charge trapping of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer or substrate, used in the following description, include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

The charge on a floating gate memory forms a Gaussian surface that spreads across the floating gate. The charge in a trapping based memory of the present invention is localized and does not spread. This property permits asymmetric charge and the ability to form multi-state cells.

Figure 1:
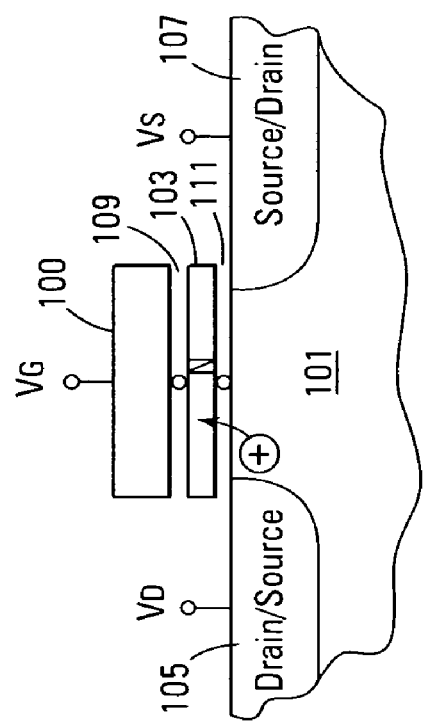
FIG. 1 shows a cut away view of one embodiment for programming a multi-state NAND memory cell with asymmetric charge trapping of the present invention.

FIG. 1 illustrates a cut-away view of one embodiment for programming a multi-state NAND memory cell with asymmetric charge trapping. This embodiment is comprised of a substrate 101 with two active areas 105 and 107. Each region 105 and 107 acts alternatively as a drain or source region, depending on the operation performed and voltages that are applied.

In one embodiment, the drain and source regions 105 and 107 are n-type conductive material while the substrate 101 is a p-type conductive material. In an alternate embodiment, these conductive material types are switched.

Above the channel between the drain/source regions 105 and 107 is an oxide-nitride-oxide (ONO) structure 103, 109, and 111. The nitride layer 103 is isolated from the substrate by a first oxide layer 111 and from a control gate 100 by a second oxide layer 109. The nitride layer 103 is the trapping layer that stores the asymmetric charges of the present invention. The present invention is not limited to any certain quantity of dielectric and/or trapping layers.

The present invention is also not limited in the composition of the dielectric/trapping layers. In one embodiment, the oxide material can be aluminum oxide. The trapping layer may be a silicon nanocrystal material. Alternate embodiments use other types of dielectric materials and/or other trapping layer materials.

The embodiment of FIG. 1 illustrates the programming of one data bit in the left side of the trapping layer 103. This is accomplished by applying a relatively high negative voltage to the control gate 100. This voltage turns off the channel in order to prevent leakage from the drain region 105 to the source region 107. In one embodiment, the gate voltage is between −10V and −15V. Alternate embodiments may use other gate voltage ranges.

An asymmetric bias is applied to the drain 105 and source regions 107. In one embodiment, a positive 5V is applied to the drain region 105 and the source region 107 is grounded (i.e., 0V). The large potential on the left side of the junction from both the gate 100 and junction field causes a gate induced drain leakage (GIDL) condition that injects holes into the trapping layer 103 near the left junction. The injected holes neutralize the electrons from a previous erased condition thus resulting in a reduced threshold voltage.

The right junction has a reduced field since the junction bias is zero. This results in a bias condition that does not inject holes. The electrons on the right side of the channel are not compensated by holes thus resulting in the initial programmed or erased condition remaining.

FIG. 2 illustrates a cut-away view of a second embodiment for programming a multi-state NAND memory cell with asymmetric charge trapping. The embodiment of FIG. 2 illustrates the programming of one data bit in the right side of the trapping layer 103. This is accomplished by applying a relatively high negative voltage to the control gate 100. This voltage turns off the channel in order to prevent leakage from the drain region 107 to the source region 105. In one embodiment, the gate voltage is between −10V and −15V. Alternate embodiments may use other gate voltage ranges.

An asymmetric bias is applied to the drain 107 and source regions 105. In one embodiment, a positive 5V is applied to the drain region 107 and the source region 105 is grounded (i.e., 0V). The large potential on the right side of the junction from both the gate 100 and junction field causes a GIDL condition that injects holes into the trapping layer 103 near the right junction. The injected holes neutralize the electrons from a previous erased condition thus resulting in a reduced threshold voltage.

The left junction has a reduced field since the junction bias is zero. This results in a bias condition that does not inject holes. The electrons on the left side of the channel are not compensated by holes thus resulting in the above-described programmed condition remaining.

FIG. 3 illustrates a cut-away view of an embodiment for erasing a multi-state NAND memory cell with asymmetric charge trapping. The erase operation is performed by tunneling electrons into the trapping layer 303 from a uniform sheet of charge in the inversion region 301. This forms a high threshold level by a continuous uniform sheet of trapped charge in the trapping layer 103. The erase operation is accomplished in one embodiment by applying a positive gate voltage in the range of 10–20V. Both the drain and source regions are grounded (i.e., 0V). Alternate embodiments may use other voltages and voltage ranges.

FIG. 4 illustrates a cut-away view of yet another embodiment of a multi-state NAND memory cell with asymmetric charge trapping. This embodiment creates a discontinuous trapping layer 403 by extending the control gate into the trapping layer 403. This results in better sensing, better data retention, and resistance to secondary emissions.

FIG. 5 illustrates a method for reading the left side of the multi-state NAND memory cell of the present invention using asymmetrical biasing of the source/drain regions. The left data bit 500 can be read by applying a relatively high bias to the right source/drain region 501 of the cell. In one embodiment, this drain voltage is in the range of 1–3V. The left drain/source region 503, acting as a source, is grounded and $V_G$ is a positive voltage in the range of 3–6V. Alternate embodiments may use other voltages and voltage ranges.

The right data bit 502 is read using an inverse process. In this embodiment, the left drain/source region 503 is grounded while the right source/drain region 501 has a relatively high voltage applied (e.g., 1–3V). $V_G$ in this read embodiment is also in the range of 3–6V. Alternate embodiments may use other voltages and voltage ranges.

Figures 6, 7:
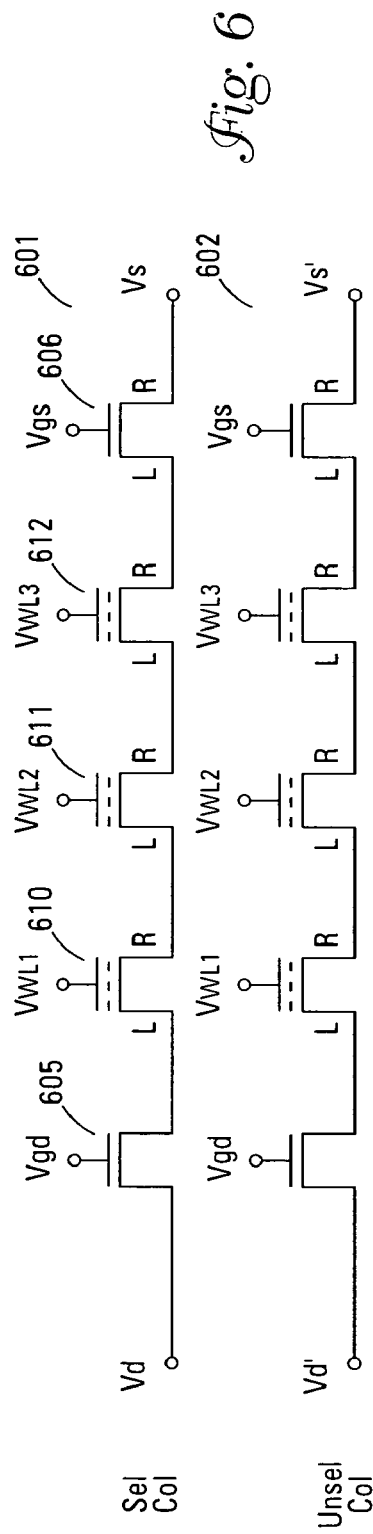
FIG. 6 shows a portion of a multi-state NAND memory cell array of the present invention.
FIG. 7 shows a table of voltages for operation of the embodiment of FIG. 6.

FIG. 6 illustrates two string arrays of multi-state NAND memory cells of the present invention. A table of voltages for different modes of operation of a selected column of this memory array is illustrated in FIG. 7.

The portion of the NAND memory array of FIG. 6 is comprised of two columns 601 and 602 of multi-state NAND memory cells as described above. One column 601 is selected while the second column 602 is unselected. The selected column 601 is comprised of a select gate 605 for the drain voltage, $V_d$, and a select gate 606 for the source voltage $V_s$. The selected column 601 is also comprised of three multi-state NAND memory cells 610–612 that are connected to control gate voltages $V_{WL1}$–$V_{WL3}$ respectively. The columns of FIG. 6 are for purposes of illustration only since a real memory column is comprised of a substantially larger quantity of cells.

Referring to the voltage table of FIG. 7, two versions of an erase operation are illustrated. In one option, as described above, the drain and source voltages, $V_d$ and $V_s$, are 0V and the control gate voltage, $V_H$, are in the range of 10–20V. In this embodiment, the control gates of the select gates 605 and 606 are connected to $V_H/2$. Other erase operation embodiments may use GIDL hole injection from both sides of the array simultaneously.

The second option for an erase operation leaves the drain and source connections floating as an open connection (O/C). In this embodiment, the select gates 605 and 606 are also floating.

During a program operation of the left bit in the middle cell 611, $V_{WL2}$ is $-V_H$ (e.g., –10 to –20V), $V_d$ is $V_{DP}$ (e.g., 3 to 6V), and $V_s$ is connected to ground. The control gates of the select gates 605 and 606 are connected to $V_{X1}$ and the control gates of the other cells 610 and 612 in the column 601 are connected to $V_{X2}$. In one embodiment $V_{X1}$ is approximately equal to $V_{X2}$ which is approximately equal to $V_{DP}+V_T$. $V_T$ is the threshold voltage of the cell as is well known in the art. The program operation of the right bit in the middle cell 611 uses substantially the same voltages as the left bit but in this case $V_S$ is connected to $V_{DP}$ and $V_d$ is connected to ground. Alternate embodiments use other embodiments to achieve substantially similar results.

During a read operation of the left bit in the middle cell 611, $V_{WL2}$ is $V_R$ (e.g., 3–6 V), $V_d$ is $V_{DR}$, and $V_S$ is connected to ground. The control gates of the select gates 605 and 606 are connected to $V_{r1}$ and the control gates of the other cells 610 and 612 in the column 601 are connected to $V_{r2}$. In one embodiment, $V_{r1}$ is approximately equal to $V_{r2}$ which is approximately equal to $V_{DR}+V_T$ where $V_{DR}$ in the range of 4–6V. The read operation of the right bit in the middle cell 611 uses substantially the same voltages as the left bit but in this case $V_S$ is connected to ground and $V_d$ is connected to $V_{DR}$. Alternate embodiments use other embodiments to achieve substantially similar results.

Figure 8:
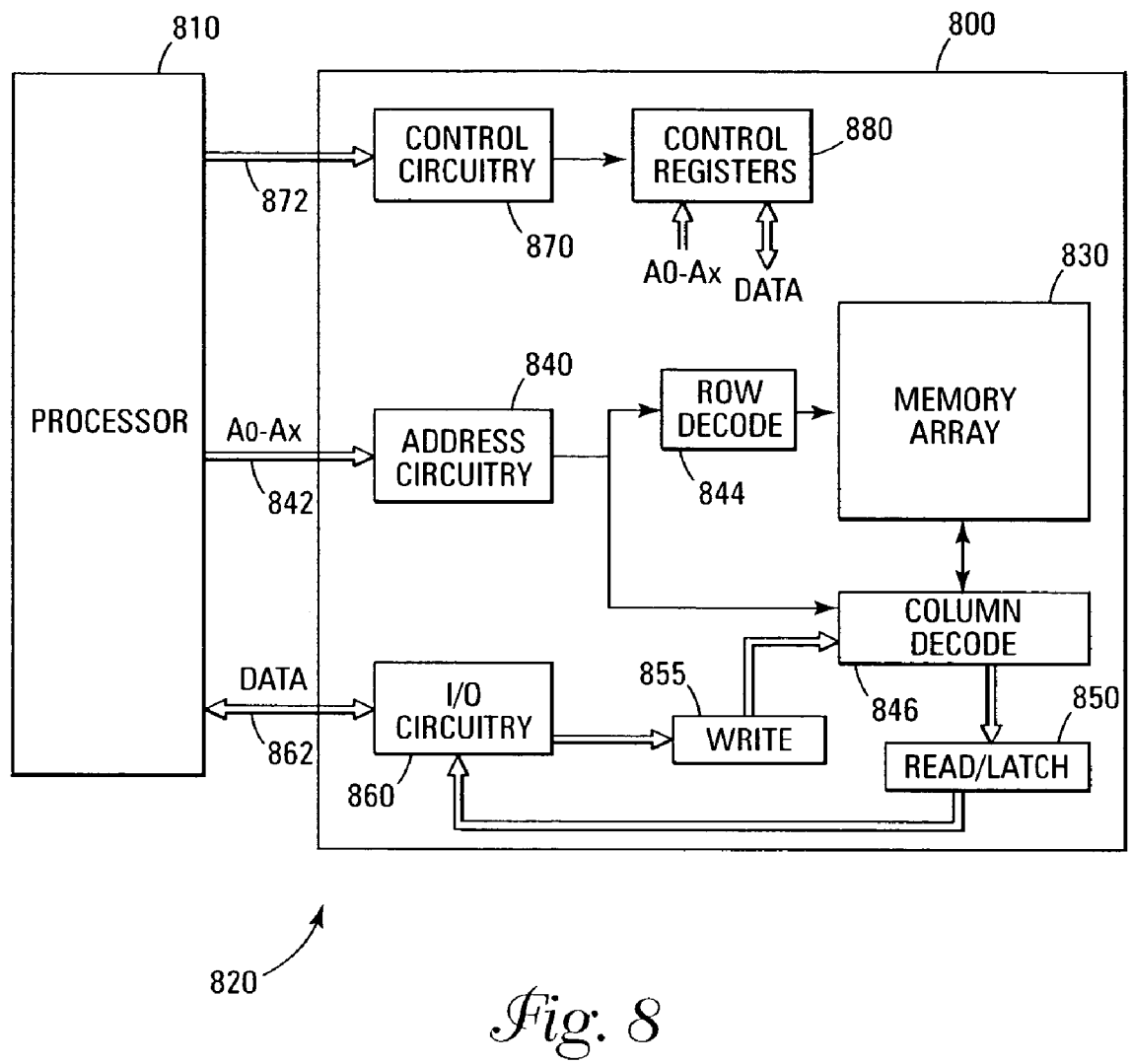
FIG. 8 shows a block diagram of one embodiment of an electronic system of the present invention.

FIG. 8 illustrates a functional block diagram of a memory device 800 that can incorporate multi-state NAND memory cells of the present invention. The memory device 800 is coupled to a processor 810. The processor 810 may be a microprocessor or some other type of controlling circuitry. The memory device 800 and the processor 810 form part of an electronic system 820. The memory device 800 has been simplified to focus on features of the memory that are helpful in understanding the present invention.

The memory device includes an array of memory cells 830. In one embodiment, the memory cells are non-volatile floating-gate memory cells and the memory array 830 is arranged in banks of rows and columns.

An address buffer circuit 840 is provided to latch address signals provided on address input connections A0–Ax 842. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense/buffer circuitry 850. The sense/buffer circuitry, in one embodiment, is coupled to read and latch a row of data from the memory array 830. Data input and output buffer circuitry 860 is included for bi-directional data communication over a plurality of data connections 862 with the controller 810). Write circuitry 855 is provided to write data to the memory array.

Control circuitry 870 decodes signals provided on control connections 872 from the processor 810. These signals are used to control the operations on the memory array 830, including data read, data write, and erase operations. The control circuitry 870 may be a state machine, a sequencer, or some other type of controller.

The flash memory device illustrated in FIG. 8 has been simplified to facilitate a basic understanding of the features of the memory. A more detailed understanding of internal circuitry and functions of flash memories are known to those skilled in the art.

Conclusion

In summary, the multi-state NAND cell of the present invention is a trapping based memory that allows asymmetric charges to be stored, thereby providing storage for two data bits. The memory cell provides high memory density, low power operation, and improved reliability due to the trapping function.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory array comprising:
   a plurality of multi-state NAND memory cells arranged in a column, each cell comprising a drain region, a source region, and a nitride trapping layer that is capable of asymmetrical charge trapping, in response to asymmetrical biasing of the drain and source regions, of a first data bit adjacent the drain region and a second data bit adjacent the source region; and
   a plurality of select gates, a first select gate at one end of the column and a second select gate at the remaining end of the column, wherein during a programming operation of a first multi-state NAND memory cell a voltage differential substantially equal to 20V between a control gate of the first cell and the source region and a voltage differential substantially equal to 25V between the control gate and the drain region when the first data bit is being programmed and a voltage differential substantially equal to 20V between the control gate and the drain region and a voltage differential substantially equal to 25V between the control gate and the source region when the second data bit is being programmed.

2. The memory array of claim 1 wherein the source voltage is substantially equal to 0V and the drain voltage is substantially equal to 5V when the first data bit is being programmed and the drain voltage is substantially equal to 0V and the source voltage is substantially equal to 5V when the second data bit is being programmed.

3. The memory array of claim 1 wherein a voltage substantially equal to –20V is applied to the control gate of the first multi-state NAND memory cell.

4. An electronic system comprising:
   a processor that controls operation of the system; and
   a NAND flash memory device having a plurality of memory cells, each memory cell comprising:
      a substrate comprising a first conductive material;

first and second active areas within the substrate, the first and second active areas comprised of a second conductive material;

a control gate above and between the first and second active areas; and a trapping layer between the control gate and the substrate such that the trapping layer is capable of asymmetrical charge trapping, in response to asymmetrical biasing of the first and second active areas, of a first data bit adjacent the first active area and a second data bit adjacent the second active area wherein during a programming operation of a first memory cell a voltage differential substantially equal to 20V between the control gate of the first cell and the second active area and a voltage differential substantially equal to 25V between the control gate and the first active area when the first data bit is being programmed and a voltage differential substantially equal to 20V between the control gate and the first active area and a voltage differential substantially equal to 25V between the control gate and the second active area when the second data bit is being programmed.

* * * * *